US005970350A

United States Patent [19]

Gardner et al.

[11] Patent Number: 5,970,350

[45] **Date of Patent: *Oct. 19, 1999**

[54] SEMICONDUCTOR DEVICE HAVING A THIN GATE OXIDE AND METHOD OF MANUFACTURE THEREOF

[75] Inventors: Mark I. Gardner, Cedar Creek; Thomas, Jr. E. Spikes, Round Rock; Robert Paiz, Austin, all of Tex.

[73] Assignee: Advanced Micro Devices, Austin, Tex.

[ * ] Notice: This patent issued on a continued prosecution application filed under 37 CFR 1.53(d), and is subject to the twenty year patent term provisions of 35 U.S.C. 154(a)(2).

[21] Appl. No.: 08/760,723

[22] Filed: Dec. 5, 1996

[51] Int. Cl.[6] .................... H01L 21/336

[52] U.S. Cl. .................... 438/287; 591/766; 591/787

[58] Field of Search .................... 438/514, 515, 438/528, 530, 762, 766, 769, 902, 770, 786, 787, 162, 165, 216, 287, 480, FOR 154, FOR 158, FOR 177, FOR 202; 148/DIG. 3, DIG. 83; 257/411

[56] References Cited

U.S. PATENT DOCUMENTS

| | | | |
|---|---|---|---|
| 4,105,805 | 8/1978 | Glendinning et al. | 438/762 |
| 4,706,377 | 11/1987 | Shuskus | 438/766 |
| 4,774,197 | 9/1988 | Haddad et al. | 437/27 |
| 4,914,046 | 4/1990 | Tobin et al. | 438/528 |
| 5,266,502 | 11/1993 | Okada et al. | 438/766 |
| 5,330,920 | 7/1994 | Soleimani et al. | 438/528 |
| 5,441,899 | 8/1995 | Nakai et al. | 438/766 |
| 5,468,657 | 11/1995 | Hsu | 438/766 |
| 5,488,004 | 1/1996 | Yang | 438/766 |
| 5,508,215 | 4/1996 | Jeng | 438/766 |
| 5,589,407 | 12/1996 | Meyyappan et al. | 438/766 |
| 5,891,798 | 4/1999 | Doyle et al. | 438/624 |
| 5,908,312 | 6/1999 | Cheung et al. | 438/287 |

FOREIGN PATENT DOCUMENTS

| | | |
|---|---|---|
| 55-001713 | 1/1980 | Japan . |
| 05267665 | 10/1993 | Japan . |

*Primary Examiner*—Savitri Mulpuri
*Attorney, Agent, or Firm*—Merchant & Gould P.C.

[57] ABSTRACT

A process for fabricating a device having a thin gate oxide layer on which a gate electrode is formed is disclosed. The thin gate oxide layer is formed using an ion implantation process in order to reliably control the thickness of the gate oxide layer. A nitrogen-containing species is used in the ion implantation in order to form a nitrogen rich oxide layer and to increase the reliability and performance of a resultant device.

20 Claims, 5 Drawing Sheets

SEMICONDUCTOR DEVICE HAVING A THIN GATE OXIDE AND METHOD OF MANUFACTURE THEREOF

FIELD OF THE INVENTION

The present invention is directed generally to a semiconductor device and method of manufacture thereof, and more particularly to such a device and method having a thin gate oxide.

BACKGROUND OF THE INVENTION

Over the last several decades, the electronics industry has undergone a revolution by the use of semiconductor technology to fabricate small, highly integrated electronic devices. The most common and important semiconductor technology presently used is silicon-based. A large variety of semiconductor devices have been manufactured having various applicability and numerous disciplines. One such silicon-based semiconductor device is a metal-oxide-semiconductor (MOS) transistor.

The principal elements of a typical MOS semiconductor device are illustrated in FIG. 1. The device generally includes a gate electrode 101, which acts as a conductor, to which an input signal is typically applied via a gate terminal (not shown). Heavily doped source 103 and drain 105 regions are formed in a semiconductor substrate 107 and are respectively connected to source and drain terminals (not shown). A channel region 109 is formed in the semiconductor substrate 107 beneath the gate electrode 101 and separates the source 103 and drain 105 regions. The channel is typically lightly doped with a dopant type opposite to that of the source 103 and drain 105 regions. The gate electrode 101 is physically separated from the semiconductor substrate 107 by an insulating layer 111, typically an oxide layer such as $SiO_2$. The insulating layer 111 is provided to prevent current from flowing between the gate electrode 101 and the semiconductor source region 103, drain region 105 or channel region 109.

In operation, an output voltage is typically developed between the source and drain terminals. When an input voltage is applied to the gate electrode 101, a transverse electric field is set up in the channel region 109. By varying the transverse electric field, it is possible to modulate the conductance of the channel region 109 between the source region 103 and drain region 105. In this manner an electric field controls the current flow through the channel region 109. This type of device is commonly referred to as a MOS field-effect-transistors (MOSFET).

Semiconductor devices, like the one described above, are used in large numbers to construct most modern electronic devices. In order to increase the capability of such electronic devices, it is necessary to integrate even larger numbers of such devices into a single silicon wafer. As the semiconductor devices are scaled down (i.e., made smaller) in order to form a larger number of devices on a given surface area, the structure of the devices and fabrication techniques used to make such devices must be altered.

One important step in the manufacture of MOS devices is the formation of the gate oxide layer. The gate oxide layer is typically grown in active regions of the device. In order to obtain a high-quality gate oxide layer, the surface of the active area is often wet-etched to remove any residual oxide. The gate oxide layer is then grown slowly, typically through dry oxidation in a chlorine ambient atmosphere. It is important to carefully control the growth of the gate oxide layer because the thickness and uniformity of the gate oxide layer can significantly impact the overall operation of the device being formed. For example, the drain current in a MOS transistor is inversely proportional to the gate-oxide thickness at a given set of terminal voltages. Accordingly, it is normally desired to make the gate oxide as thin as possible, taking into consideration the oxide breakdown and reliability considerations of the process and technology being used.

The above described conventional techniques for forming gate oxide layers impose limitations on the minimum thickness of the gate oxide layer and on the ability to control the uniformity of the gate oxide layer. As the thresholds for minimum thickness and uniformity control are reached, the ability to further scale down the semiconductor devices is hindered.

SUMMARY OF THE INVENTION

Generally, the present invention relates to a semiconductor device having an implanted gate oxide layer and a process for manufacturing such a device. Consistent with the present invention a semiconductor device is formed having a thin gate oxide layer disposed on a substrate of the device. A gate electrode is disposed on the gate oxide layer. In accordance with an aspect of the invention the thin gate oxide has a thickness which is less than 35 angstroms.

In accordance with another aspect of the invention a semiconductor device having a thin gate oxide is fabricated using a process in which an oxygen containing species is implanted into a substrate. The implanted oxygen is used to form the gate oxide layer. A gate electrode is disposed on the oxide layer. In accordance with one particular aspect of the invention nitrogen is also implanted into the substrate providing greater control over the formation of the gate oxide layer. In accordance with another aspect of the invention a single implanted species contains both oxygen and nitrogen.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
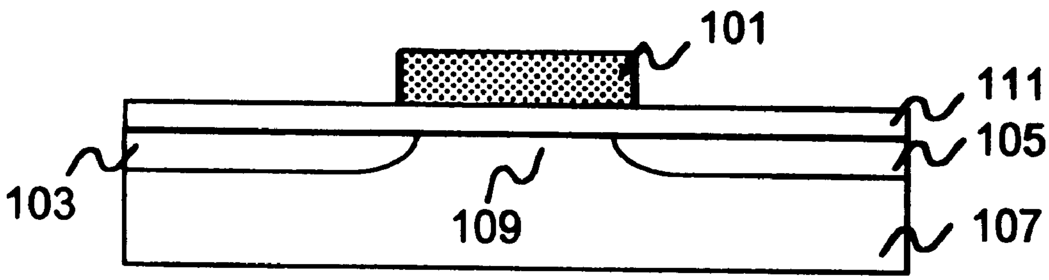
FIG. 1 illustrates components of a MOS semiconductor device.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

Detailed Description of the Various Embodiments

The present invention is believed to be applicable to a number of semiconductor devices which have a gate electrode disposed on a gate oxide. The invention has been found to be particularly advantageous in application environments where it is desirable to precisely control the formation of a thin gate oxide layer used in a MOS device. While the present invention is not so limited, an appreciation of various aspects of the invention is best gained through a discussion of various application examples of processes used to form such semiconductor devices.

Figure 2A:
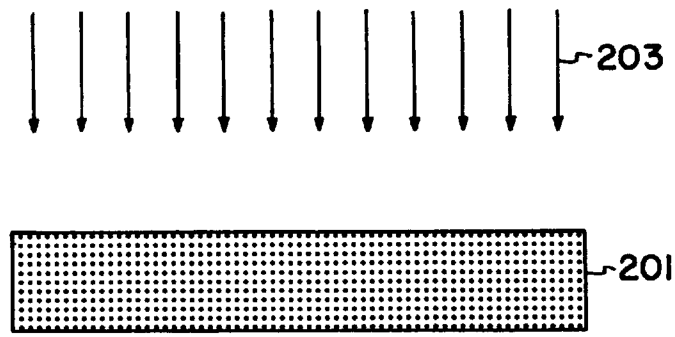
FIGS. 2A through 2D illustrate a fabrication process in accordance with an embodiment of the invention for forming a semiconductor device.

With reference to FIGS. 2A through 2D, a process for fabricating a semiconductor device in accordance with a particular embodiment of the present invention will be described. In FIG. 2A, a silicon substrate 201 is implanted with a source of ions 203. The source of ions 203 could be a number of different oxygen containing species. While oxygen alone could be used as the implant species, in accordance with one embodiment of the invention implantation of both oxygen and nitrogen will provide enhanced control over the gate oxide layer formation as more fully described below. In the example illustrated in FIG. 2A, an implant gas source such as $N_2O$ or NO could be used to implant both oxygen and nitrogen into the substrate in a single implantation step.

The implantation may be carried out using standard equipment and techniques. The implantation energy and ion dosage is selected to control the implantation depth of the implanted species in accordance with a desired thickness of the oxide gate. For example, implantation energies ranging from 2 to 30 KeV would be suitable for many applications. The dosages of the ions will also vary depending on the desired thickness and energies used. Generally the dosages will range from $1\times e^{13}$–$1\times e^{20}$ ions/cm. In this dosage range, at an implantation energy of 5 KeV for example, $N_2O$ ions could be used to form a controlled, shallow implant into the silicon substrate 201.

Figure 2B:
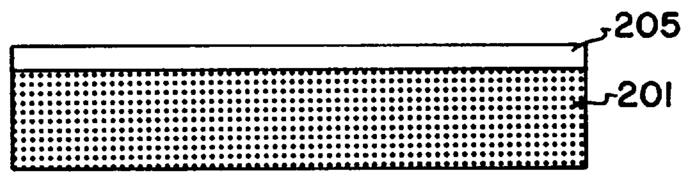
Figure 2C:
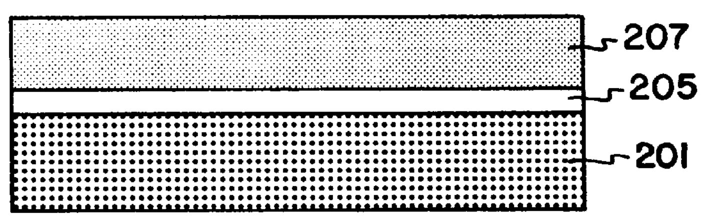

The substrate 201, with the implanted species, is subsequently annealed in an inert atmosphere. The anneal process, forms an oxide layer 205, as illustrated in FIG. 2B, by combining the implanted oxygen with the silicon to form $SiO_2$. In the case where nitrogen is also implanted into the substrate a nitrogen-rich oxide layer 205 is formed. A standard polysilicon gate electrode layer 207 is disposed on the gate oxide layer 205 as illustrated in FIG. 2C.

Figure 2D:
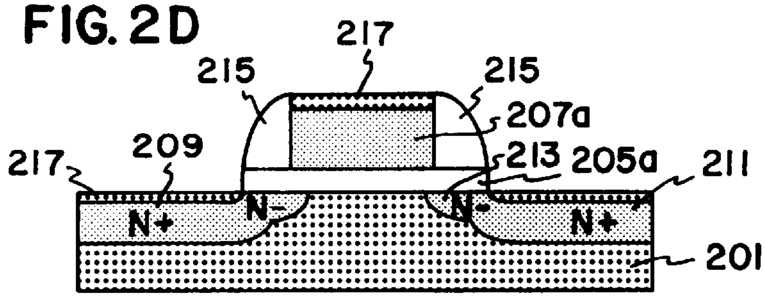

The gate electrode layer 207 may be masked and etched using known techniques to form gate electrodes in desired regions of the structure. The process will vary, as is known in the art, depending on the ultimately desired structure of the semiconductor device being formed. The structure depicted in FIG. 2C may be processed into a number of different structures. An example of lightly doped drain (LDD) MOS device manufactured in accordance with the present invention is illustrated in FIG. 2D. The LDD MOS device includes a gate oxide 205A and a gate electrode 207A processed in the manner described above. The device further includes source 209 and drain 211 regions, LDD regions 213, sidewall spacers 215, and a silicide layer 217. The devices may be formed using known techniques to obtain the ultimate structural characteristics desired.

As noted above, using an implantation process to form the gate oxide layer 205 of such a semiconductor device has a number of advantages. The thickness of the gate oxide layer can be controlled with greater precision than that of a conventionally grown gate oxide layers. This allows for the formation of thin gate oxide layers having a thickness, for example, of 35 angstroms or less. By controlling the ion implantation energies, dosages and selection of implantation species, oxide layers as thin as 10 to 25 angstroms can be obtained.

Another advantage of the above-described fabrication process in which nitrogen is also implanted results from the presence of nitrogen in the gate oxide. The presence of nitrogen in the gate oxide layer 205 improves the reliability and characteristics of the ultimately produced semiconductor device. For example, nitrogen in the gate oxide of a semiconductor MOS device serves to prevent the doping agent in the gate electrode (e.g. boron atoms in a PMOS device) from diffusing through the thin gate oxide layer and into the channel region. Another advantage of using nitrogen in the fabrication process results when extremely thin gate oxide layers are formed. In this instance, the nitrogen will tend to extend into the gate electrode polysilicon layer improving device reliability and reducing dopant diffusion.

Figure 3A:
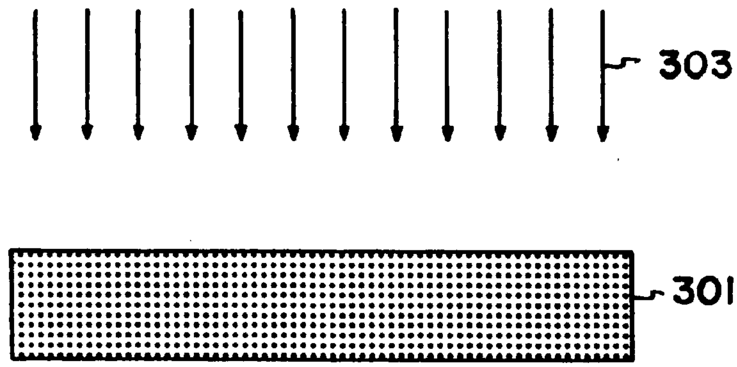
FIGS. 3A through 3C illustrate another fabrication process in accordance with a second embodiment of the invention.
Figure 3B:
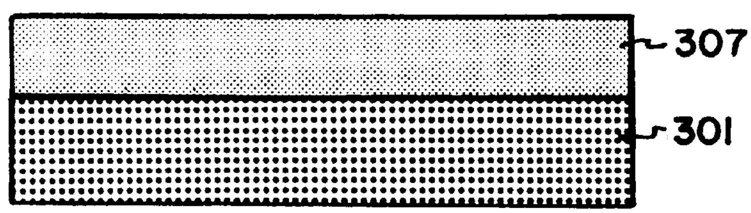
Figure 3C:
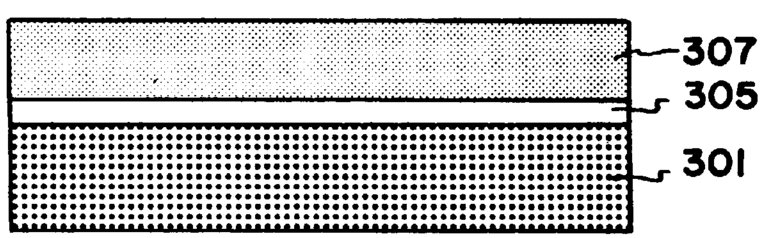

As described above, using an implantation process to form a gate oxide layer provides improved performance and reliability. FIGS. 3A through 3C illustrate an alternative fabrication process in accordance another embodiment of the invention in which ion implantation is used to form the gate oxide layer. A silicon substrate 301 is implanted with an oxygen containing species as illustrated in FIG. 3A. As described above, the species may further contain nitrogen. Next, a polysilicon gate electrode layer 307 is deposited on top of the substrate 301 as illustrated in FIG. 3B. The resulting structure is then subjected to an inert anneal process to form a gate oxide layer 305 between the substrate 301 and the gate electrode layer 307. The resulting structure, illustrated in FIG. 3C, is similar to that depicted in FIG. 2C and exhibits the advantageous characteristics described above and may be used to fabricate a number of different semiconductor devices.

Figure 4A:
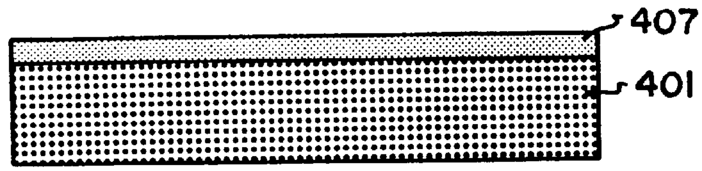
FIGS. 4A through 4C illustrate still another fabrication process in accordance with an embodiment of the invention.
Figure 4B:
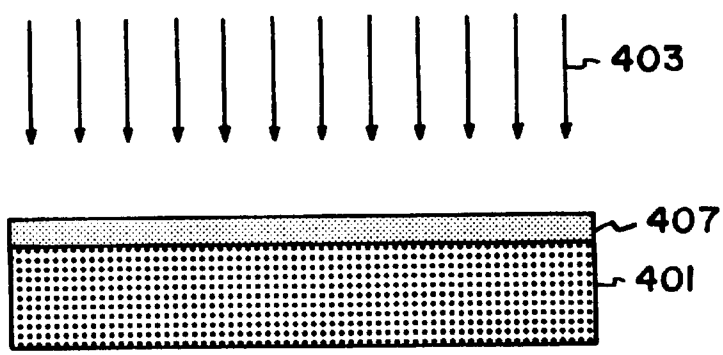
Figure 4C:
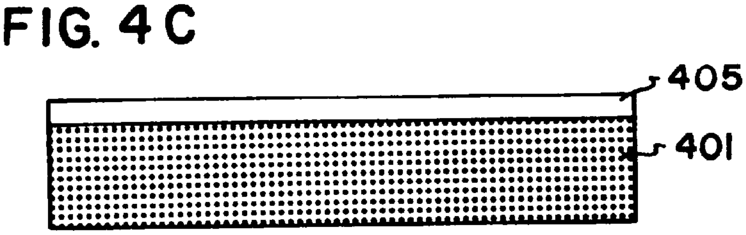

FIGS. 4A through 4B illustrate still another fabrication process in which ion implantation is used to form a gate oxide layer. A thin layer of material, such as a photoresist material, is initially deposited on the substrate 401 as illustrated in FIG. 4A. The implantation process is then carried out through this thin layer of material, as illustrated in FIG. 4B. The thin layer 407 is used to provide additional control over the implantation depth into the substrate 401. Implantation through the thin layer may also allow higher energies to be used and thereby increases implantation control. Once the implantation process is complete, the thin layer 407 may be removed. An anneal process is performed to form the gate oxide layer 405. It should be appreciated that the use of a thin layer as part of the implantation process could be used in connection with any of the various implantation process described herein. The resulting structure depicted in FIG. 4C may be further processed into a number of different semiconductor devices having the advantageous described above.

Figure 5A:
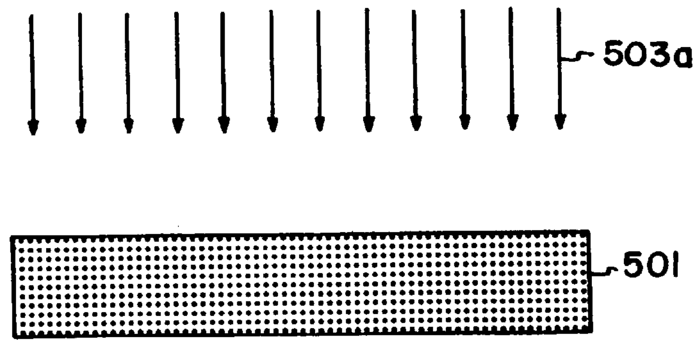
FIGS. 5A through 5C illustrate another fabrication process in accordance with the embodiment of the invention.
Figure 5B:
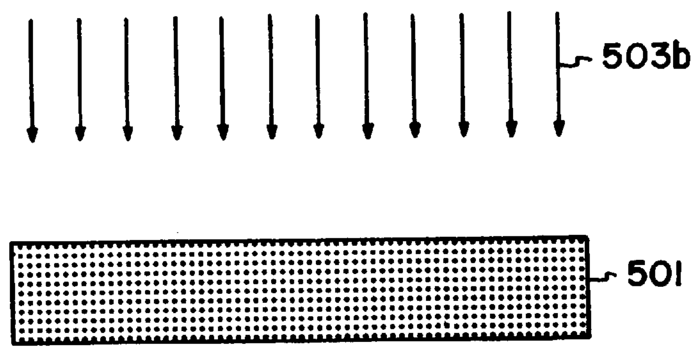
Figure 5C:
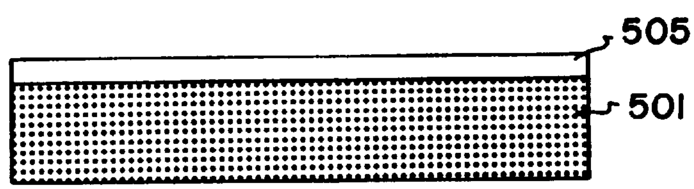

FIGS. 5A through 5C illustrate still another fabrication process in which a two step implantation process is used to separately implant oxygen and nitrogen containing species into the substrate. A first species, containing oxygen for example, is implanted into the substrate 501 as illustrated in FIG. 5A. Next, a second species, containing nitrogen for example, is implanted into the substrate 501 as illustrated in FIG. 5B. It is noted that the order of implantation is provided by way of example and could be reversed. Examples of various gases which are suitable for use in the two-step implantation process depicted in FIGS. 5A–5B include $O_2$, $N_2$, $NH_3$, $NF_3$, and any other nitrogen containing species which can be implanted into the substrate Following the two implantation steps, a nitrogen-rich gate oxide layer 505 is formed by subjecting the implanted structure to an inert annealing process. It should be appreciated that the two-step implantation process could be used in place of the single step implantation process described in connection with the various examples above.

In each of the above processes, different dosages and energies could be used for the implantation depending on the desired characteristics of the gate oxide layer. As will be appreciated having read the above description, typical energy values would range between 2–30 KeV. Similarly, typical dosages will vary between $1\times e^{13}$ $-1\times e^{20}$. It will also be appreciated that the annealing process step used in the various described fabrication techniques may also be implemented in a variety of ways. For example, a tube anneal process could be used where the temperature would be ramped up, at a rate of approximately 7° C./min., from a starting temperature (e.g., room temperature) to a temperature ranging from 800 to 1050° C. Alternatively, a rapid thermal process could be used quickly ramping the annealing temperature to approximately 1050° C. Generally any suitable process could be used to form an oxide layer from the implanted species.

As noted above, the present invention is applicable to fabrication of a number of different devices where improved control over the formation of the gate oxide layer and/or the associated advantages obtained therefrom are desired. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art upon review of the present specification. The claims are intended to cover such modifications and devices.

We claim:

1. A process of forming a semiconductor device, the process comprising:

implanting an oxygen containing species and a nitrogen containing species into a substrate to form a nitrogen and oxygen bearing layer in the substrate;

annealing the implanted substrate to form a nitrogen bearing gate oxide layer, from the nitrogen and oxygen bearing layer, on an outer surface of the substrate; and forming a gate electrode on the nitrogen bearing gate oxide layer.

2. A process as recited in claim 1, wherein the oxygen containing species and the nitrogen containing species each include the same oxygen and nitrogen containing species.

3. A process as recited in claim 2, wherein the oxygen and nitrogen containing species comprises $N_2O$.

4. A process as recited in claim 2, wherein the oxygen and nitrogen containing species comprises NO.

5. A process as recited in claim 1, further comprising forming a surface layer of material on the surface of the substrate prior to the implanting of the oxygen containing species and the nitrogen containing species, the oxygen containing species and the nitrogen containing species being implanted through the surface layer.

6. A process as recited in claim 5, wherein the first layer comprises a temporary layer of material.

7. The process of claim 1, wherein forming the gate electrode includes depositing a polysilicon layer over the gate oxide layer.

8. The process of claim 1, wherein implanting the oxygen containing species and the nitrogen containing species is performed in a single step.

9. The process of claim 1, wherein implanting the oxygen containing species and the nitrogen containing species is performed in multiple steps.

10. A process for forming a semiconductor device, the process comprising:

implanting an oxygen containing species into an outer surface of a substrate to form an oxygen bearing region at the outer surface of the substrate, wherein oxygen containing species includes nitrogen containing species depositing a gate electrode layer on the outer surface of the implanted substrate; and annealing the implanted substrate and the gate electrode layer in an inert atmosphere to form a gate oxide layer, from the oxygen bearing region, between the substrate and the gate electrode layer.

11. A process as recited in claim 10, wherein the oxygen and nitrogen containing species comprises $N_2O$.

12. A process as recited in claim 10, wherein the oxygen and nitrogen containing species comprises NO.

13. The process of claim 10, further including implanting a nitrogen containing species into the outer surface of the substrate prior to annealing the substrate wherein annealing the implanted substrate forms a nitrogen bearing gate oxide layer.

14. The process of claim 13, wherein implanting the oxygen containing species and the nitrogen containing species are performed in a single step.

15. A process of fabricating a semiconductor device, comprising:

implanting an oxygen containing species into an outer surface of a substrate substantially free of any covering material to form an oxygen bearing layer at the outer surface, wherein oxygen containing species includes nitrogen containing species annealing the implanted substrate to form a gate oxide layer, from the oxygen bearing layer, on the outer surface of the substrate; and forming a gate electrode on the gate oxide layer.

16. The process of claim 15, further including implanting a nitrogen containing species into the outer surface of the substrate prior to annealing the substrate, wherein annealing the implanted substrate forms a nitrogen bearing gate oxide layer.

17. The process of claim 16, wherein implanting the oxygen containing species and implanting the nitrogen containing species are performed in a single step.

18. A process of fabricating a semiconductor device, comprising:

forming a temporary layer over a surface of a substrate;

implanting an oxygen containing species through the temporary layer into a substrate to form an oxygen bearing layer in an outer surface region of the substrate, wherein oxygen containing species includes nitrogen containing species annealing the implanted substrate to form a gate oxide layer, from the oxygen bearing layer, on an outer surface of the substrate;

removing the temporary layer; and forming a gate electrode on the gate oxide layer.

19. The process of claim 18, further including implanting a nitrogen containing species into the outer surface region of the substrate prior to annealing the substrate, wherein annealing the implanted substrate forms a nitrogen bearing gate oxide layer.

20. The process of claim 19, wherein implanting the oxygen containing species and implanting the nitrogen containing species are performed in a single step.

* * * * *

UNITED STATES PATENT AND TRADEMARK OFFICE
CERTIFICATE OF CORRECTION

PATENT NO. : 5,970,350

DATED : October 19, 1999

INVENTOR(S) : Gardner et al.

It is certified that error appears in the above-identified patent and that said Letters Patent is hereby corrected as shown below:

In the heading, the second inventor's name should read Thomas E. Spikes, Jr.

Signed and Sealed this

Tenth Day of April, 2001

Nicholas P. Godici

Attest:

NICHOLAS P. GODICI

*Attesting Officer*

*Acting Director of the United States Patent and Trademark Office*